(12) United States Patent
Haeberlen et al.

(10) Patent No.: US 9,620,467 B2
(45) Date of Patent: Apr. 11, 2017

(54) ELECTRONIC COMPONENT

(71) Applicant: Infineon Technologies Austria AG, Villach (AT)

(72) Inventors: Oliver Haeberlen, St. Magdalen (AT); Ralf Otremba, Kaufbeuren (DE); Gerhard Prechtl, Rosegg (AT); Klaus Schiess, Allensbach (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/855,462

(22) Filed: Sep. 16, 2015

(65) Prior Publication Data

US 2016/0086897 A1    Mar. 24, 2016

(30) Foreign Application Priority Data

Sep. 18, 2014    (DE) .......................... 10 2014 113 465

(51) Int. Cl.
| | | |
|---|---|---|
| *H01L 23/482* | (2006.01) | |
| *H01L 23/00* | (2006.01) | |
| *H01L 23/528* | (2006.01) | |

(52) U.S. Cl.
CPC .......... *H01L 24/05* (2013.01); *H01L 23/4824* (2013.01); *H01L 23/5283* (2013.01); *H01L 2224/02351* (2013.01); *H01L 2224/02372* (2013.01); *H01L 2224/04042* (2013.01); *H01L 2924/1032* (2013.01); *H01L 2924/13064* (2013.01); *H01L 2924/13091* (2013.01)

(58) Field of Classification Search
CPC    H01L 29/778; H01L 23/4824; H01L 23/5283
See application file for complete search history.

(56) References Cited

U.S. PATENT DOCUMENTS

| | | | |
|---|---|---|---|
| 6,372,586 B1 | 4/2002 | Efland et al. | |
| 6,815,276 B2 | 11/2004 | Hower et al. | |
| 7,186,592 B2 | 3/2007 | Schillaci et al. | |
| 2005/0179081 A1 | 8/2005 | Kitamura et al. | |
| 2013/0299878 A1* | 11/2013 | Briere ................... | H01L 29/778 257/194 |

FOREIGN PATENT DOCUMENTS

DE    102004039402 A1    9/2005

* cited by examiner

*Primary Examiner* — Douglas Menz
(74) *Attorney, Agent, or Firm* — Murphy, Bilak & Homiller, PLLC

(57) ABSTRACT

In an embodiment, a semiconductor device includes a lateral transistor device having an upper metallization layer. The upper metallization layer includes n elongated pad regions. Adjacent ones of the n elongated pad regions are coupled to different current electrodes of the lateral transistor device. The n elongated pad regions bound n−1 active regions of the lateral transistor where n≥3.

20 Claims, 11 Drawing Sheets

ELECTRONIC COMPONENT

PRIORITY CLAIM

This application claims priority to German Patent Application No. 10 2014 113 465.6 filed on 18 Sep. 2014, the content of said application incorporated herein by reference in its entirety.

BACKGROUND

A semiconductor device may include a metallization structure arranged on a semiconductor material body which includes electrically conductive tracks coupled between electrodes of the semiconductor device and contact pads. The metallization structure may include multiple electrically conductive layers. Conductive connections may be made to the contact pads to electrically couple the semiconductor device to a substrate or a leadframe of a package which includes outer contacts. The outer contacts are used to mount the package on a redistribution board, such as a printed circuit board. The package may include a housing which covers the semiconductor device and the internal electrical connections.

SUMMARY

In an embodiment a semiconductor device includes a lateral transistor device metallizationing an upper metallization layer. The upper metallization layer includes n elongated pad regions. Adjacent ones of the n elongated pad regions are coupled to different current electrodes of the lateral transistor device. The n elongated pad regions bound n-1 active regions of the lateral transistor, wherein n≥3.

Those skilled in the art will recognize additional features and advantages upon reading the following detailed description and on viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
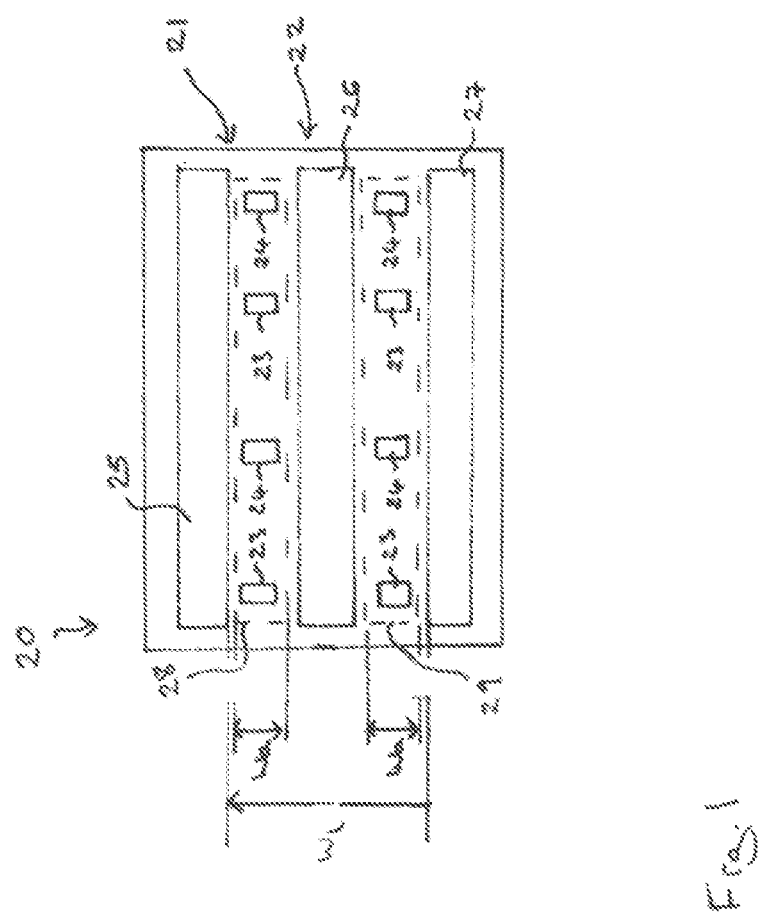
FIG. 1 illustrates the semiconductor device including an upper metallization layer according to a first embodiment.

FIG. 1 illustrates a semiconductor device 20 according to a first embodiment including a lateral transistor device 21 and an upper metallization layer 22. The upper layer metallization layer 22 includes a first elongated pad region 25, a second elongated pad region 26 and a third elongated pad region 27. The second elongated pad region 26 is arranged between the first elongated pad region 25 and the third elongated pad region 26. The first elongated pad region 25 and the second elongated pad region 26 bound a first active region 28 of the lateral transistor device 22 and the second elongated pad region 26 and the third elongated pad region 27 bound a second active region 29 of the lateral transistor device 22. The elongated pad regions 25, 26, 27 are arranged in non-active regions of the lateral transistor device 21 adjacent the long sides of the substantially rectangular active regions 28, 29.

Each of the elongated pad regions 25, 26, 27 is substantially rectangular and the elongated pad regions 25, 26, 27 are arranged substantially parallel to one another. Each of the active regions 28, 29 is bounded on its two long sides by one of the elongated pad regions 25, 26, 27.

As used herein, an "active region" is a region of a lateral transistor device that can support a lateral, electrically conductive layer. As used herein a "non-active region" is a region of a lateral transistor device that cannot support a lateral, electrically conductive layer. A non-active region may be electrically insulating and may comprise a different material from the semiconductor material of the active region. For a HEMT (High Electron Mobility Transistor) such as a gallium nitride based HEMT, the active region is a region of the lateral transistor device in which a two-dimensional electron gas (2DEG) is supported when the gate is switched on. The non-active region is a region in which no 2DEG is supported when the gate is switched on. The non-active regions may be formed by ion implantation for isolation or by removing the AlGaN barrier layer by, for example, mesa etching.

Adjacent elongated pad regions are coupled to different current electrodes 23, 24 of the transistor device arranged in the active regions 28, 29. The first elongated pad region 25 and the third elongated pad region 27 may be coupled to a common current electrode 23 of the lateral transistor device 21, such as the source and the second elongated pad region 26 is coupled to a different current electrode 24 of the lateral transistor device 21 such as the drain.

The area of the semiconductor device 20 and lateral transistor device 22 is divided such that two active areas 28, 29 are provided each of which has a width $w_a$ which is less than the width $w_1$ between the outermost elongated pad regions 25, 27.

The arrangement of the upper metallization layer 21 may be used for any lateral transistor device. In some embodiments, the lateral transistor device is an LDMOS (Lateral Diffused Metal Oxide Semiconductor) transistor device or a High Electron Mobility Transistor (HEMT) device, such as a Group III-nitride or gallium nitride-based HEMT. The lateral transistor device may also be a gallium nitride-based device or compound semiconductor lateral transistor device.

Figure 2:
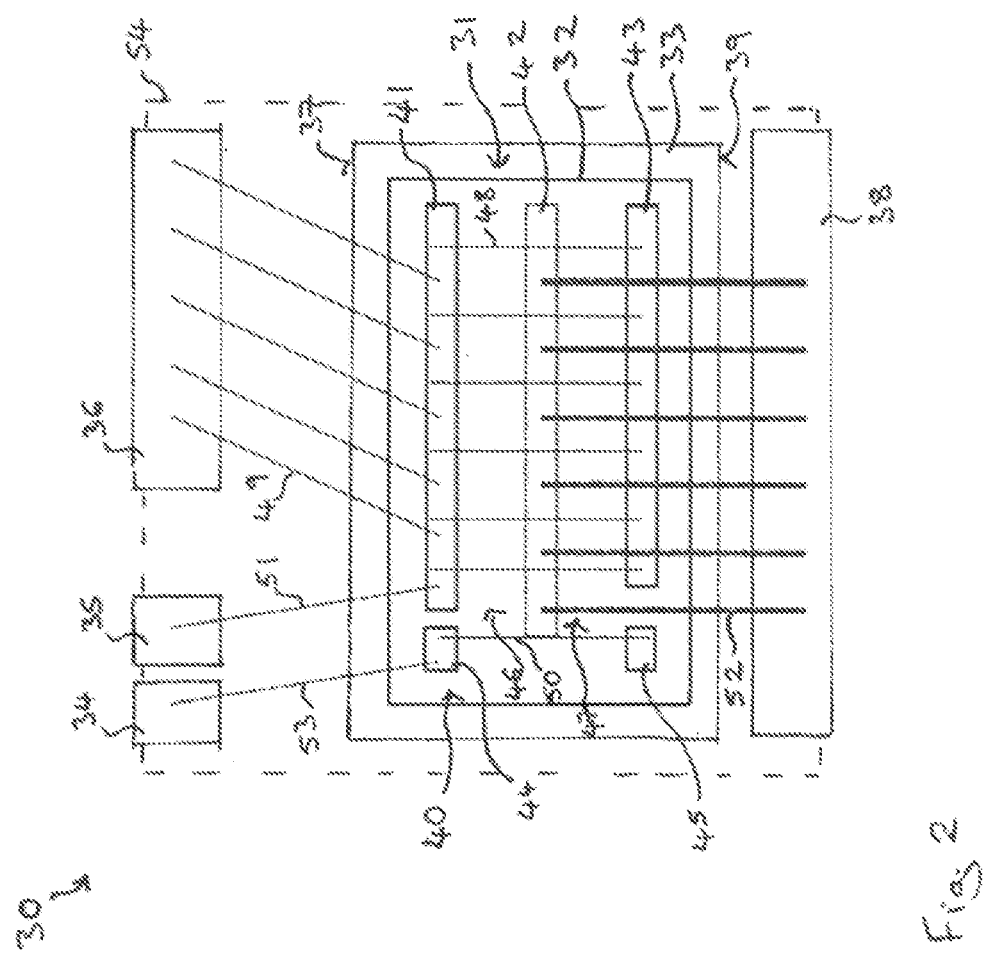
FIG. 2 illustrates a top view of a semiconductor package according to a first embodiment.

FIG. 2 illustrates a top view of a semiconductor package 30 according to a first embodiment. The semiconductor package 30 includes a semiconductor device 31 including a lateral transistor device 32 mounted on a die pad 33. The semiconductor package 30 includes three leads 34, 35, 36 arranged adjacent and spaced apart from a first side face 37 of the die pad 33 and a fourth lead 38 arranged adjacent and spaced apart from a second side face 39 of the die pad 33, the second side face 39 opposing first side face 37. The die pad 33 and leads 34, 35, 36, 38 may be part of a leadframe including copper.

The lateral transistor device 32 includes an upper metallization layer 40 which includes three elongated pad regions 41, 42, 43 each of which is substantially rectangular. The elongated pad regions 41, 42, 43 are arranged substantially parallel to one another. The outermost elongated pad regions 41, 43 are coupled to the source electrodes of the lateral transistor 31 and the centre elongated pad region 42 is coupled to the drain electrodes of the lateral transistor device 32. The upper metallization layer 40 further includes two gate pads 44, 45 arranged adjacent the elongated pad regions 41, 43 coupled to the source electrodes. The first elongated pad region 41 and the second elongated pad region 42 bound opposing long sides of a first active region 46 and the second elongated pad region 42 and the third elongated pad region 43 bound opposing long sides of a second active region 47.

The upper metallization layer 40 is not limited to the number of pads illustrated in FIG. 2. For example, the upper metallization layer 40 may include a single gate pad, two or more drain pads interleaved with 3 or more source pads etc.

The first elongated pad region 41 is electrically coupled to the third elongated pad region 43 by a plurality of bond wires 48. A second plurality of bond wires 49 extend between the first elongated pad region 41 and the third contact 36 and electrically couple the source electrodes of the lateral transistor device 32 to the lead 36 by means of both the first elongated pad region 41 and the second elongated pad region 43. The two gate pads 44, 45 are electrically coupled to one another by a bond wire 50. The gate pad 44 is electrically coupled to the first contact 34 by a further bond wire 53.

In this particular embodiment, the semiconductor package 30 includes a source sensing function which is provided by a bond wire 51 extending between the second contact 35 and the first elongated pad region 41. The second elongated pad region 42 is electrically coupled to the fourth contact 38 by a plurality of bond wires 52. The bond wires 52 are arranged such that individual bond wires are arranged between pairs of the plurality of bond wires 48 which extend between the first elongated pad region 41 and the third elongated pad region 43. An alternating arrangement of bond wires coupled to the source and the drain of the lateral transistor device 32 is provided.

The semiconductor package 30 further includes a plastic package housing indicated by the dotted line 54, in which the semiconductor device 31, the bond wires 48, 49, 50, 51, 52, 53 and portions of the contacts 34, 35, 36, 38 are embedded. The outermost portions of the contacts 34, 35, 36, 37 remain exposed from the plastic package housing and provide outer contacts for the semiconductor package 30.

The bond wires 48 which electrically couple the first elongated pad region 41 and the third elongated pad region 43 extend substantially perpendicularly to the long direction of the first elongated pad region 41 and the third elongated pad region 43. The bond wires 48 are spaced at a distance above the upper surface of the lateral transistor device 32 and are electrically insulated by the plastic package housing.

Figure 3:
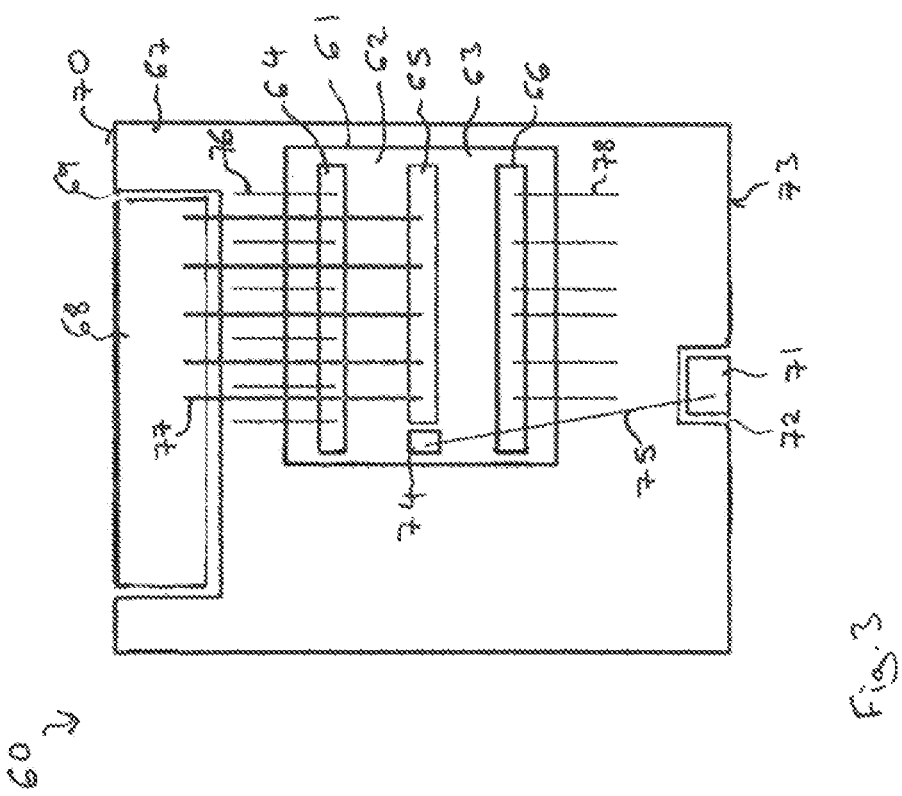
FIG. 3 illustrates a top view of a semiconductor package according to a second embodiment.

FIG. 3 illustrates a top view of a semiconductor package 60 according to a second embodiment. The semiconductor package 60 includes a semiconductor device including a lateral transistor 61 such as a gallium nitride-based HEMT. The lateral transistor 61 includes two strip like active areas 62, 63 which are bounded on each of the long sides by an elongated conductive pad. Each of the active areas 62, 63 includes a plurality of source, gate and drain electrodes arranged such that the gate electrode is arranged between a source electrode and a drain electrode to form a transistor cell. A first elongated conductive pad 64 is coupled to the source electrodes of the active area 62, the second elongated conductive pad 65 is electrically coupled to the drain electrodes of the first active area 62 and the second active area 63 and the third elongated conductive pad 66 is electrically coupled to the source electrodes of the second active area 63.

The lateral transistor 61 is mounted on a die pad 67 of the semiconductor package 60. The semiconductor package 60 further includes a first lead 68 arranged in a cutout 69 in a side face 70 of the die pad 67 and a lead 71 arranged in a cutout 72 in the opposing side face 73 of the die pad 67. The leads 68, 71 are spaced at a distance and are electrically isolated from the die pad 67. The gate pad 74 of the lateral transistor device 61 is electrically coupled to the lead 71 by a bond wire 75. The first elongated pad 61 is electrically coupled to the die pad 67 by a plurality of bond wires 76, the second conductive pad 65 is electrically coupled to the lead 68 by a plurality of bond wires 77 which alternate with the plurality of bond wires 76 such that alternating connections to the source and drain are provided. The third conductive pad 66 is electrically coupled to the die pad 67 by a plurality of bond wires 78. The die pad 67 is therefore coupled to the source electrodes of the first active area 62 and second active area 63. The semiconductor package 60 further includes a plastic package housing which is not illustrated in FIG. 3.

The semiconductor devices illustrated in FIGS. 1 to 3 each include two active areas which are bounded on two sides by elongated pad region. However, the lateral transistor device may be provided with more than two active regions. For example, n elongated pad regions, wherein n is natural number greater or equal to three, may be provided which are arranged adjacent or between n-1 active areas may be provided.

Figure 4:
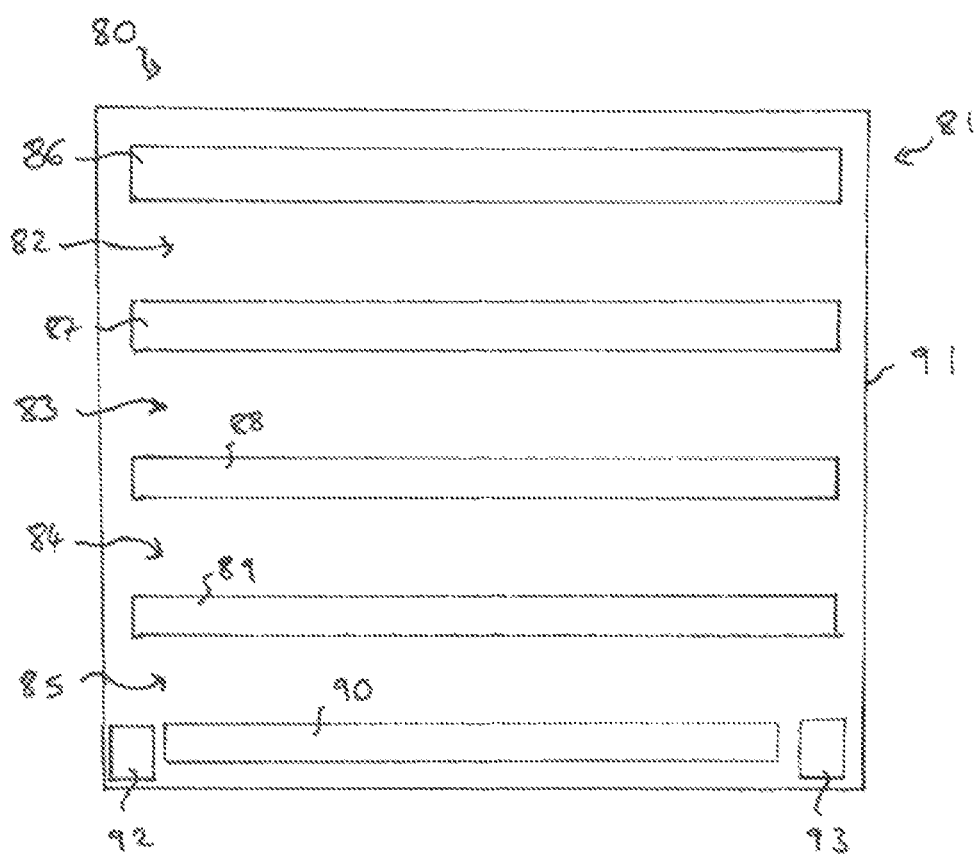
FIG. 4 illustrates a semiconductor device including an upper metallization layer according to a second embodiment.

FIG. 4 illustrates a top view of a semiconductor device 80 including an upper metallization layer 81 and four active regions 82, 83, 84, 85 each having a substantially strip like form. The active regions 82, 83, 84, 85 together provide a lateral transistor device 91. Elongated pad regions 86, 87, 88, 89, 90 are arranged adjacent the two long sides of the active regions 82, 83, 84, 85, whereby adjacent elongated pads are coupled to different current electrodes of the lateral transistor device 91 of the semiconductor device 80. For example, the elongated pad regions 86, 88 and 90 may be coupled to source and the elongated pad regions 87, 89 may be coupled to drain.

The elongated pad region 86 may be coupled to source electrodes in the active region 82, the elongated pad region 87 to drain electrodes in the two adjacent active regions 82, 83, the elongated pad region 88 to source electrodes of the two adjacent active regions 83, 84, the elongated pad region 85 to drain electrodes of the two adjacent active regions 84, 85 and elongated pad region 92 source electrodes in the active region 85. The lateral transistor device 91 also includes two gate pads 92, 93 each of which is coupled to gate electrodes in each of the active areas 82, 83, 84, 85.

Figure 5:
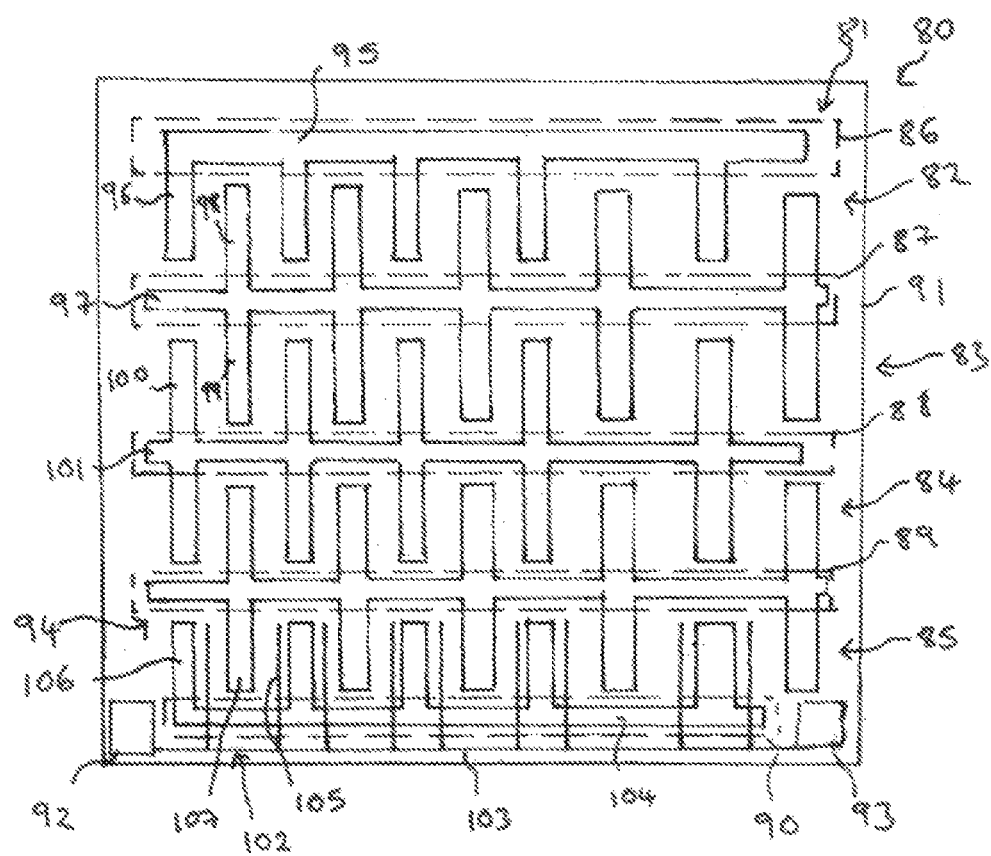
FIG. 5 illustrates a top view of the semiconductor device illustrated in FIG. 4 and illustrates an intermediate metallization layer.

FIG. 5 illustrates a further top view of the semiconductor device 80 illustrated in FIG. 4 and illustrates a view of an intermediate metallization layer 94 which is arranged underneath the upper metallization layer 81. The position of the upper metallization layer 81 is indicated with dashed lines.

The intermediate metallization layer 94 includes a plurality of runners, each extending substantially parallel to the elongated pad regions 86, 86, 88, 89, 90 of the upper metallization layer 81 and conductive fingers which extend substantially perpendicular to the length of the runners of the intermediate metallization layer 94 and the elongated pad regions 86, 87, 88, 89, 90.

The intermediate metallization layer 94 includes a runner 95 which is arranged underneath and substantially parallel to the elongated pad region 86. The runner 95 extends into a plurality of fingers 96 which extend substantially perpendicularly to the runner 95 and elongated pad region 86 and into the active region 82. The fingers 96 are electrically coupled to source electrodes within the active region 82.

A further runner 97 of the intermediate metallization layer 94 is positioned under the elongated region 87 and extends substantially parallel to the elongated pad region 87. The runner 97 also extends into a plurality of fingers 98 which extend into the first active region 82. The fingers 98 extend in regions between fingers 96 of the first runner 95 such that the fingers 96, 98 of the active region 82 are coupled to source or drain alternately along the breadth of the active region 82. Adjacent pairs of fingers 96, 98 form a transistor cell in the active region 82.

The runner 97 also includes a plurality of fingers 99 which extend in the opposing direction into the active region 83 and are connected to drain electrodes arranged in the active region 83. The fingers 99 alternate with further fingers 100 coupled to source electrodes of the active region 83 which extend from a runner 101 arranged under the elongated pad region 88. The runners 95, 97, 100 are electrically coupled to the respective overlying elongated pad 86, 87, 88 of the upper metallization layer by at least one conductive via which extends through a dielectric layer arranged between the intermediate metallization layer 94 and the upper metallization layer 81. This pattern of runners and fingers is repeated for the active regions 84 and 85.

The position of the gate electrodes in the active areas 82, 83, 84, 85 is illustrated for one of the active areas 85 only. The lateral transistor device 94 further includes a lower metallization layer 102 which is positioned underneath the intermediate metallization layer 94. The arrangement of the connection between the gate pads 92, 93 and the gate electrodes of the lower metallization layer 102 is illustrated for active area 85.

The lower metallization layer 102 includes a runner 103 which is positioned outside the source runner 104 of the intermediate metallization layer 94 and the elongated pad region 90 of the upper metallization layer 81. The runner 103 is substantially parallel to the runner 104 and includes a plurality of conductive fingers 105 which extend into the active area 85 and are coupled to gate electrodes. Each of the conductive fingers 105 coupled to a gate electrode is arranged between a source electrode 106 and a drain electrode 107 of the active area 85. The fingers 105 extend underneath the runner 104 of the intermediate metallization layer 94. The fingers 105 are positioned slightly closer to the respective source electrode than to the respective drain electrode of a transistor cell.

In each of the active areas 82, 83, 84, 85, the source, gate and drain electrodes of the transistor cells and the overlying layers of the lower metallization layer 102 and the intermediate metallization layer 94 are substantially parallel to one another. Coupling of the individual electrodes and fingers of the metallization layers is achieved through the use of runners which are positioned in inactive areas of the lateral transistor adjacent the active areas. In the active areas of the lateral transistor device, metallic traces of the layers of the metallization structure do not cross one another at an angle. Furthermore, the runners coupled to source and drain are arranged on opposing sides of the active area.

This arrangement of only parallel arranged metallic traces in the active areas and the common runners for source and drain on opposing sides of the active areas reduces source-drain or parasitic capacitance. The thickness of the dielectric layers arranged between the various conductive metallization layers may also be selected to produce the capacitance. In one embodiment, the thickness of the dielectric layer between the semiconductor material of the semiconductor device and the upper metallization layer 81 is at least 20 μm. This dielectric layer may be provided by a portion of a circuit board material such as glassfibre reinforced epoxy resin.

The active area of the lateral transistor device is divided into two or more active regions, each of which includes metallic traces in the form of fingers which have a length which is less than the length which would be used for a single active area which extends substantially over the entire area of the transistor device. By reducing the length of the fingers, electromigration of the fingers may be reduced.

In some embodiments, lateral transistor device metallizations a Group III nitride-based High Electron Mobility Transistor (HEMT) which is a high-voltage depletion mode transistor. In these embodiments, the semiconductor material of the device may include a gallium nitride sublayer arranged on a substrate and an aluminum gallium nitride sublayer arranged on the gallium nitride sublayer. The interface between the gallium nitride sublayer and the aluminum gallium nitride sublayer may support a two dimensional electron gas (2DEG) formed by induced and spontaneous polarization. A further gallium nitride cap layer and/or a dielectric layer and/or passivation layers may be arranged on the aluminum gallium nitride layer.

Figure 6:
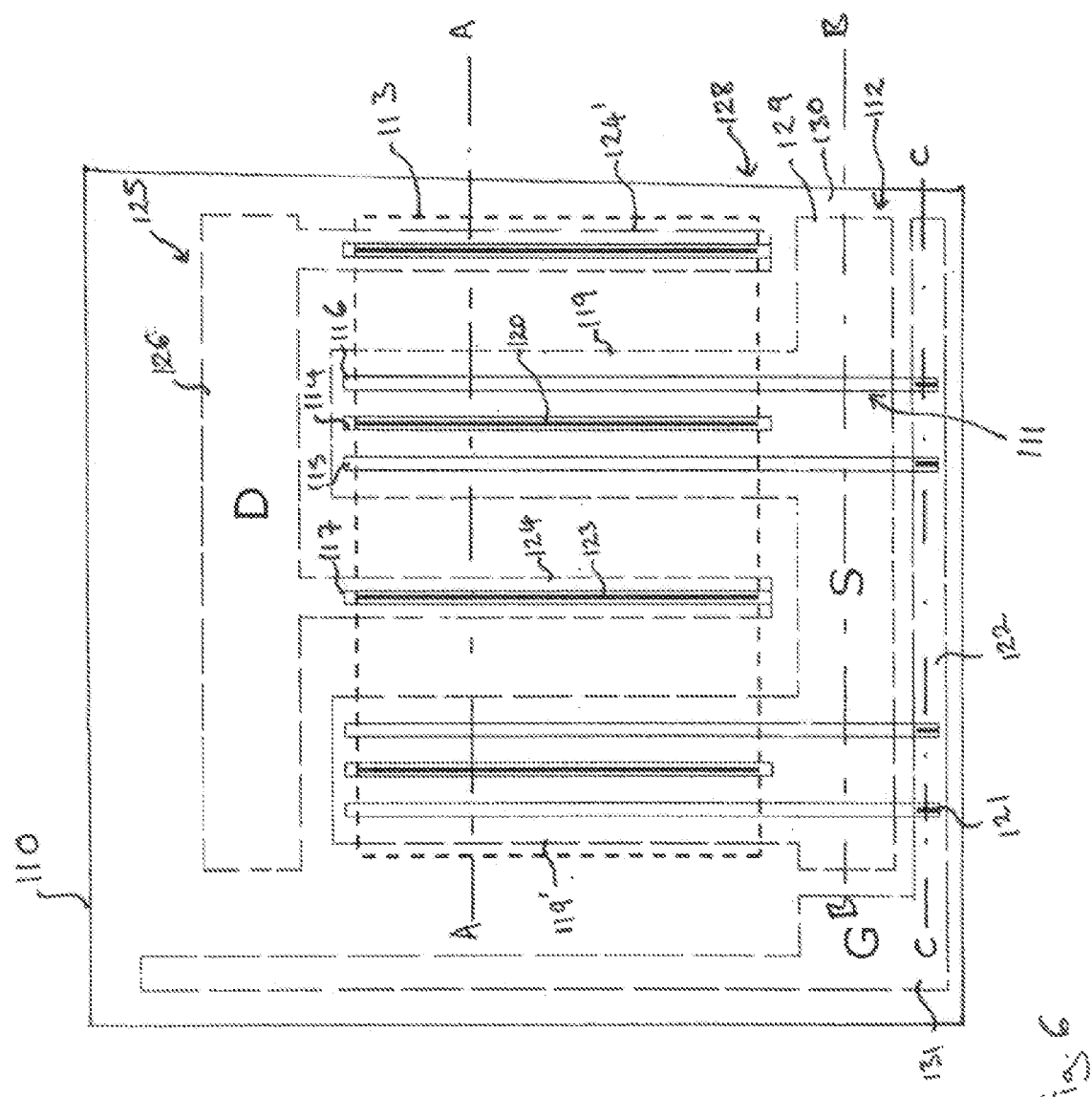
FIG. 6 illustrates a top view of an intermediate metallization layer and a lower metallization layer according to a third embodiment.

FIG. 6 illustrates a top view of a portion of a lateral transistor device 110 according to a third embodiment including a lower metallization layer 111 illustrated with solid lines and an overlying intermediate metallization layer 112 indicated with dashed lines.

The lower metallization layer 111 includes a plurality of substantially parallel metallic strips arranged in the active area 113 of the lateral transistor device 110. The lateral transistor device 110 may be a LDMOS transistor, but, in this particular embodiment, is a gallium nitride-based HEMT.

The lower metallization layer 111 includes a first metallic strip 114 and two further metallic strips 115, 116 arranged on opposing sides. The metallic strip 114 is coupled to a source electrode of the lateral semiconductor transistor device and the strips 115, 116 are electrically coupled to gate electrodes of the lateral transistor device 110. The strips 115, 116 extend from one side of the active area 113 outside the active area 113 to a peripheral portion of the lateral transistor device 110. A further metallic strip 117 is arranged adjacent to the metallic strip 115 and is electrically coupled to the drain of the lateral transistor device 110. This structure is repeated along the length of the active area 113 such that a metallic strip coupled to the gate electrode is arranged between a metallic strip coupled to a source electrode and a metallic strip coupled to the drain electrode to form a transistor cell of the lateral transistor device 110.

A dielectric layer 118 is arranged on the lower metallization layer 111. A plurality of conductive vias extends through the dielectric layer 118 to electrically couple the lower metallization layer 111 to the intermediate metallization 112.

Figure 7:
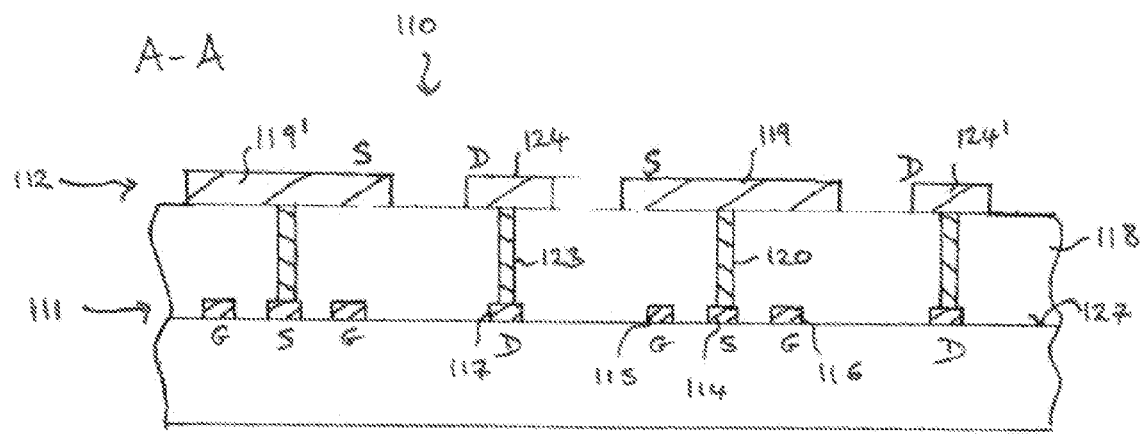
FIG. 7 illustrates a cross-sectional view along the line A-A of FIG. 6.

FIG. 7 illustrates a cross-sectional view along the line A-A of FIG. 6 and illustrates a cross-sectional view of the active area 113 including conductive vias 120, 123 extending between the conductive strips 114, 117 of the lower metallization layer 111 and the fingers 119, 124, respectively, of the upper metallization layer 112.

The metallic strip 114 which is coupled to the source electrode is coupled to a source redistribution 119 of the upper metallization layer by conductive via 120 which has an elongated structure extending along the length of the metallic strip 114. In other embodiments, the conductive via may have a substantially circular cross-section and a plurality of conductive vias may be arranged at intervals along the length of the metallic strip 14 to electrically couple the source electrode to the portion 119 of the intermediate metallization layer 112 which is coupled to all of the source electrodes of the active area 113.

A conductive via 121 extends from the peripheral portion of each of the gate electrodes 115, 116 through the dielectric layer 118 to a portion 112 of the intermediate metallization layer 112 which forms a gate runner. A further conductive via 123 extends between the strip 117 coupled to the drain electrode to the drain redistribution 124 of the intermediate metallization layer 112 which is coupled to all of the drain electrodes of the active area 113.

The drain redistribution 125 of the intermediate metallization layer 112 includes the fingers 124 which are arranged above the metallic strip 117 in the active area 113 of the lateral semiconductor device 110 and a runner 126 which extends substantially perpendicularly to the fingers 124 to electrically couple the plurality of fingers 124 and drain electrodes to one another. The runner 126 is positioned outside of the active area 113 in a non-active area of the lateral semiconductor device 110. Furthermore, the runner 126 is spaced at a distance from the upper surface 127 of the semiconductor material of the lateral semiconductor device by the thickness of the dielectric layer 118. This arrangement may be used to decrease source-drain parasitic capacitances.

The source redistribution 128 of the intermediate metallization layer 112 has a similar structure including the fingers 119 which extend substantially parallel to the underlying strip type metal portions 114 within the active area 113 and a runner 129. The runner 129 substantially perpendicular to the fingers 119 and which is positioned outside of the active area 113 in a non-active area 130 of the lateral transistor device 110 on the opposing side of the active area 113 to the drain redistribution 126. The fingers 124 coupled to the drain electrodes and the fingers 119 coupled to the source electrodes are interleaved within the active area 113 and a gate electrode is arranged between adjacently arranged fingers 124, 119.

In this embodiment, the fingers 119 of the source redistribution 128 of the intermediate metallization layer 112 have a width such that they extend over the strips 115, 116 of the lower metallization layer 111 which are coupled to the gate electrodes. In other embodiments, the fingers of the intermediate metallization layer do not cover the gate electrodes. The fingers 119 of the source redistribution 128 can also provide a field plate effect. The finger portions 124 of the drain redistribution 125 of the intermediate metallization layer 112 have a smaller width but are slightly wider than the width of the strip 117 of the lower metallization layer 111 that is coupled to the drain electrodes.

Figure 8:
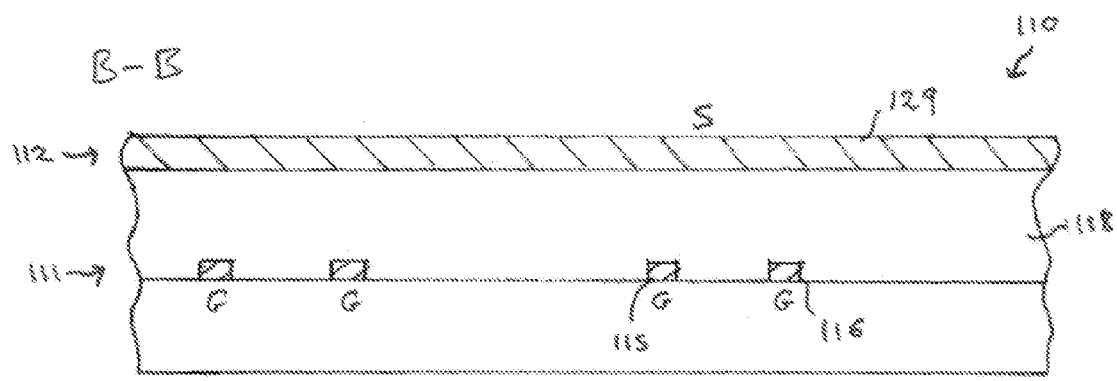
FIG. 8 illustrates a cross-sectional view along the line B-B of FIG. 6.

FIG. 8 illustrates a cross-sectional view along the line B-B of FIG. 6 and illustrates that the strips 115, 116 which are coupled to the gate electrodes extend underneath the runner portion 129 of the intermediate metallization layer 112 to the periphery of the lateral transistor device 110 and are electrically insulated from the runner portion 129 by the dielectric layer 118.

Figure 9:
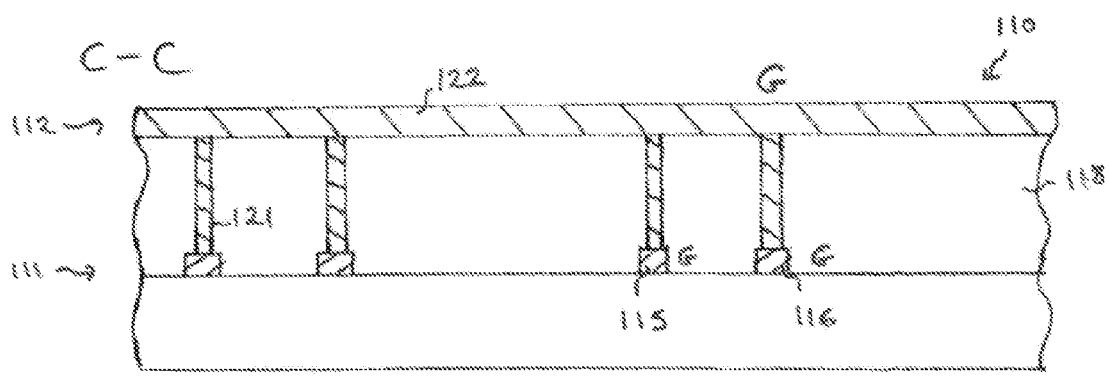
FIG. 9 illustrates a cross-sectional view along the line C-C of FIG. 6.

FIG. 9 illustrates a cross-sectional view along the line C-C of FIG. 6. As is illustrated in FIG. 9, each of the metallic strips 115, 116 are connected to the gate runner 122 of the intermediate metallization layer 112 by the conductive vias 121.

The arrangement of the two metallization layers 111, 112 is illustrated in FIGS. 6 to 9 may be used to provide a two layer metallization structure for the lateral transistor device 110. These embodiments, the electrical connections between the runners 126, 129 and the gate pad 131 to internal contact areas of the redistribution structure of a semiconductor package may be made, for example, by bond wire connections.

Figure 10:
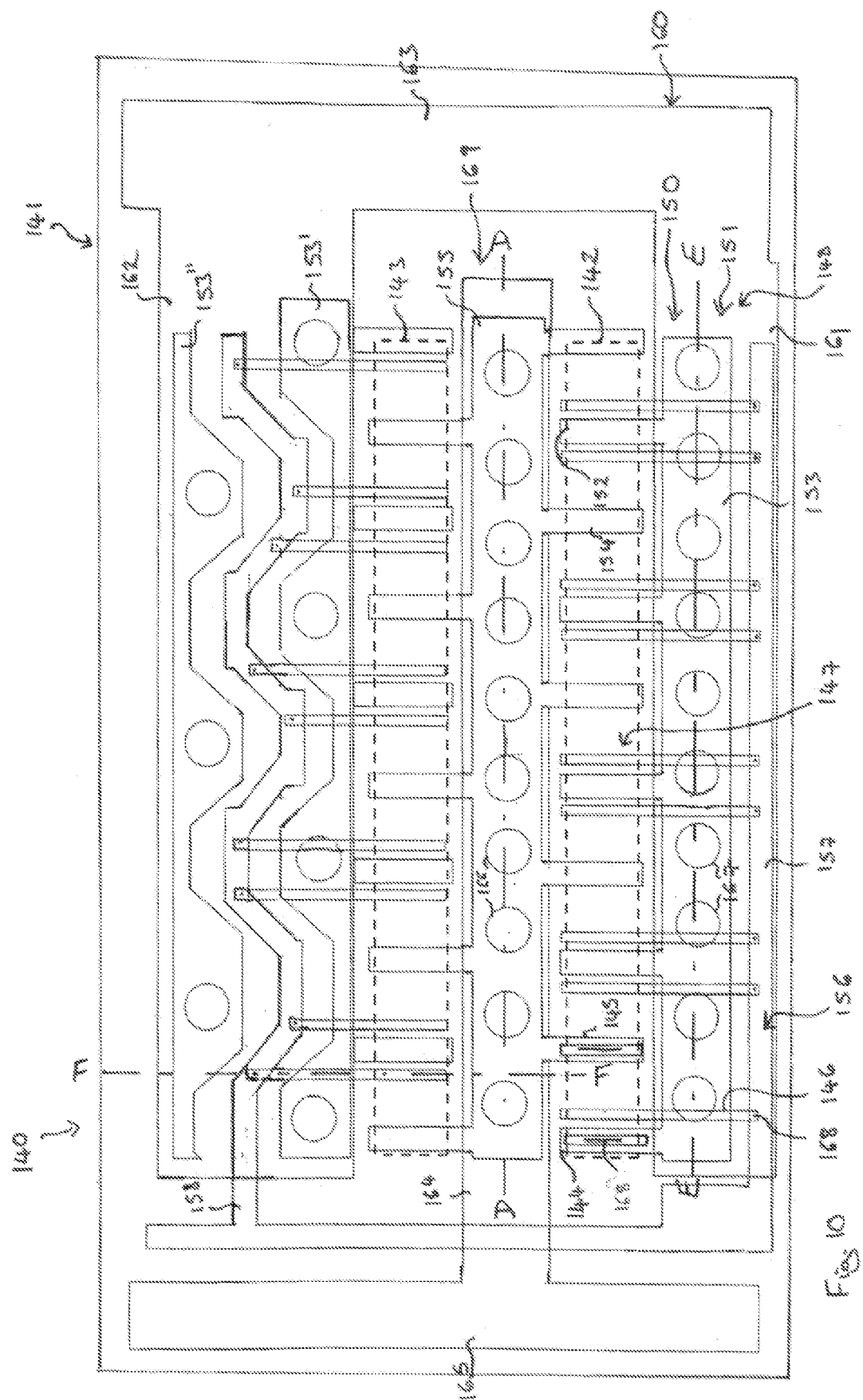
FIG. 10 illustrates a top view of a semiconductor device with a three layer metallization structure according to a fourth embodiment.

FIG. 10 illustrates a top view of a lateral transistor device 140 according to a fourth embodiment. The lateral transistor device is a gallium nitride-based HEMT.

The lateral transistor device 140 includes a multilayer metallization structure 141 including three electrically conductive, for example metallic, layers and two dielectric layers. Furthermore, the lateral transistor device 140 includes a plurality of active areas of which two active areas 142, 143 are illustrated in the top view of FIG. 10. The arrangement of the metallization structure will be described in connection with the two active areas 142, 143. However, the region illustrated in FIG. 10 may be considered to be a single repeat of a larger pattern which may be extended across the lateral transistor device 140 if more than two active areas are to be provided.

Each of the active areas 142, 143 is substantially rectangular and may be considered as a strip. Each of the active areas 142, 143 may be considered to include a plurality of transistor cells, each including a source 144, a drain 145, which is spaced apart from the source 144 and a gate 146 which is arranged between the source 144 and the drain 145. The sources 144, gates 146 and drains 145 are each electrically coupled to individual conductive strips which extend across the width of the active area 142, whereby the width refers to the shorter dimension of the rectangular shape of the active area 142.

The conductive layer of the lower metallization structure 147 which is coupled to the gate 146 extends outside of the active area 142 into a non-active area 148 of the lateral transistor device 140 which may be either located at the perimeter of the lateral semiconductor device 140 or between repeat units including two active regions 142, 143.

A first dielectric layer 149 is arranged on the lower metallization layer 147 and an intermediate metallization layer 150 is arranged on the first dielectric layer 149.

The intermediate metallization layer 150 includes a source redistribution structure 151 which electrically couples each of the sources 144 in the active area 142 to one another. The source redistribution structure 151 includes a plurality of fingers 152 which are positioned above and substantially parallel to the conductive strips coupled to the source 144. The conductive strips of the lower metallization layer 147 are electrically coupled to the fingers 152 by a conductive via 168. The plurality of fingers 152 are electrically coupled to one another by a bus 153 which extends substantially parallel to the long side of the active area 142.

The intermediate metallization layer 150 includes a similar drain redistribution structure 169 for electrically coupling the drain electrodes 145 of the active region 142.

The drain redistribution structure 169 of the intermediate metallization structure 150 includes a plurality of conductive fingers 154 which are arranged above the conductive strips coupled to the drains 145 and which are substantially parallel to the conductive strips 144 coupled to source. The fingers 154 are coupled together by a bus 155 which extends substantially parallel to the long side of the active area 142 opposite to the source bus 153. The fingers 154 of the drain redistribution xxx interleave with the fingers 152 of the source redistribution 151.

The intermediate metallization layer 150 further includes a gate redistribution structure 156 which is electrically coupled to the gates 146 in at least one active area. The gate redistribution structure 156 includes a runner 157 which extends substantially parallel to the long side of the active area 142 and which is positioned adjacent an outermost face of the bus 153 which is coupled to the sources 144 of the active area 142. The gate redistribution structure 156 may also extend adjacent end faces of two or more active regions 142, 143 and include a further runner 158 which is positioned adjacent the second active area 143 on the opposing side of the second active area 143 to the drain bus 155.

In the active areas 142, 143, the intermediate metallization structure includes fingers 152, 154 which are arranged parallel to the underlying conductive strips and sources, drains and gates of the lateral transistor device 140. The buses and runners which couple the sources, drains and gates of the active area together are positioned outside of the active areas 143, 144. There are no conductive connections between the conductive strips and sources, drains and gates of the lateral transistor device 140 within the active areas 142, 143.

The metallization structure 141 further includes a second dielectric layer 159 arranged on the intermediate metallization layer 150 and an upper metallization layer 160 which is arranged on the second dielectric layer 159.

The upper metallization layer 160 electrically couples the source electrodes of at least two active areas 42, 43 to one another and couples the drain electrodes of at least two adjacent active areas 142, 143.

As is illustrated in the top view of FIG. 10, the upper metallization layer 160 includes two finger portions 161, 162 which extend substantially parallel and above the source bus 151 and the gate runner 157 of the intermediate metallization layer 150. The fingers 161, 162 are electrically coupled to one another by a bus 163 which is positioned in an inactive area of the lateral semiconductor device 140 adjacent side faces of the active areas 142, 143. The fingers 161, 162 of the upper metallization layer 160 are arranged substantially perpendicular to the fingers 152, 154 of the underlying intermediate metallization layer 150 and the bus 163 is arranged substantially perpendicular to the bus 153 of the underlying intermediate metallization structure 150.

Similarly, a finger 164 of the upper metallization layer 160 is arranged above and substantially parallel to the drain bus 155 of the intermediate metallization layer 150 which is electrically coupled to the drains in the two active areas 142, 143. The finger 164 is coupled to a bus 165 which is arranged adjacent a side face of the active areas 142, 143 opposing the bus 163 coupling the source electrodes. The fingers 161, 162 coupled to source may be considered to be interleaved by the finger 164 coupled to drain.

Figure 11:
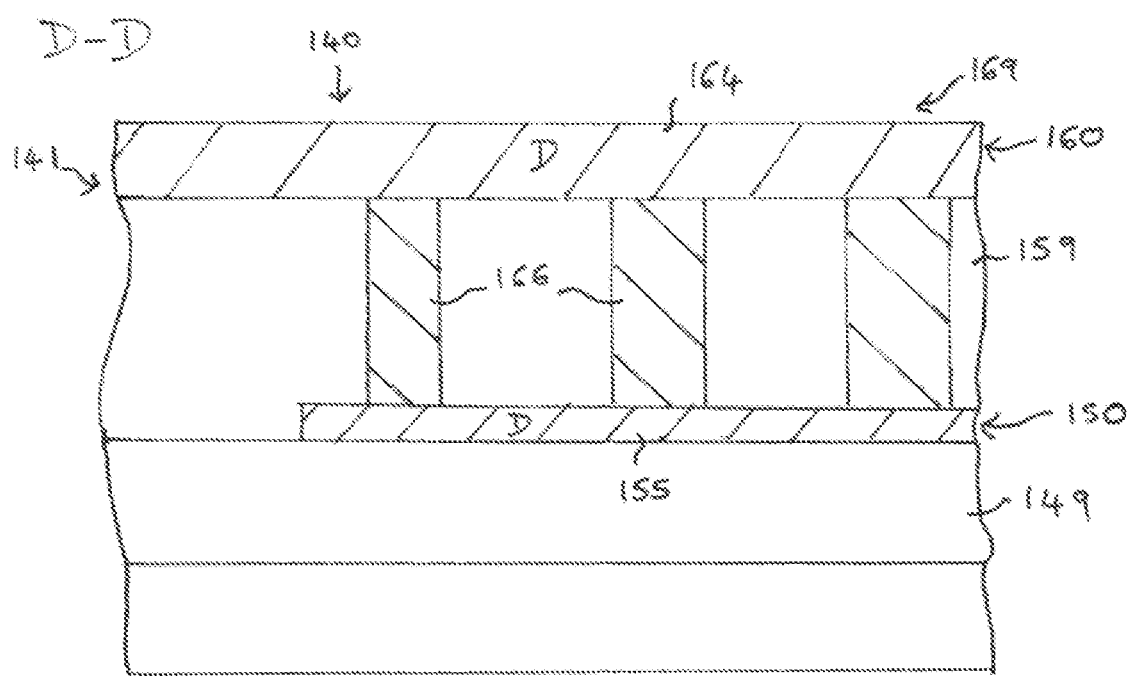
FIG. 11 illustrates a cross-sectional view along the line D-D of FIG. 10.

FIG. 11 illustrates a cross-sectional view along the line D-D of FIG. 10 though the drain finger 164 and drain bus 165 and illustrates that the drain bus 165 of the intermediate metallization layer 150 is electrically coupled to the drain finger 164 of the upper metallization layer 160 by a plurality of conductive vias 166 which are positioned at intervals along the length of the bus 165 and which extend through the second dielectric layer 159.

Figure 12:
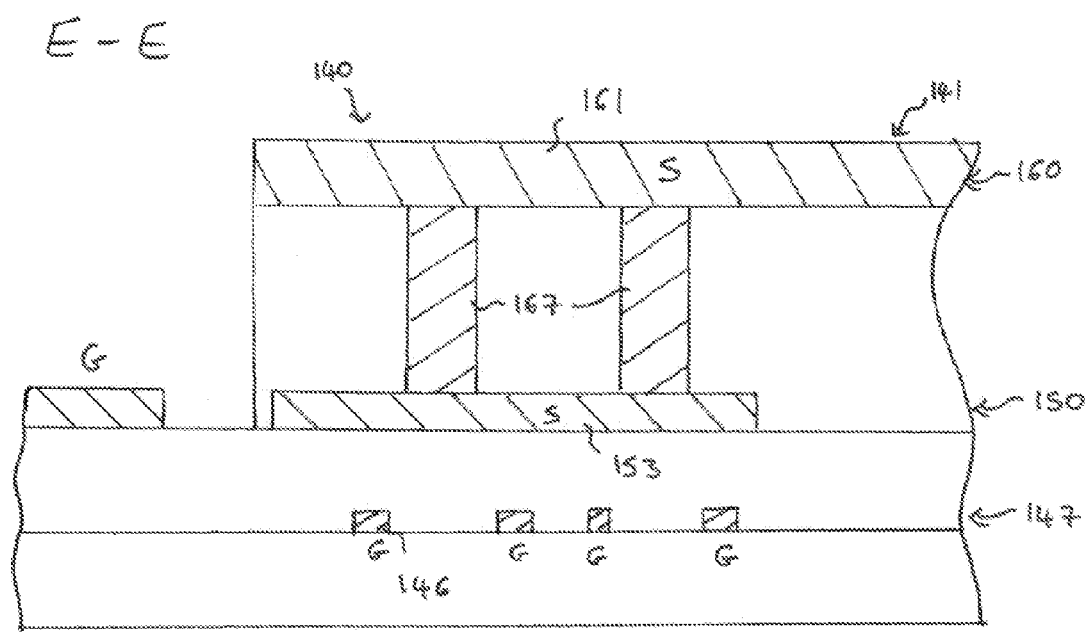
FIG. 12 illustrates a cross-sectional view along the line E-E of FIG. 10.

FIG. 12 illustrates a cross-sectional view along the line E-E of FIG. 10 through the source finger 162 and source bus 153. A plurality of conductive vias 167 are positioned at intervals along the length of the source bus 153 and extend through the second dielectric layer 159 to electrically coupled the source bus 153 of the intermediate metallization layer 150 to the source fingers 161, 162 of the upper metallization layer 160.

The second dielectric layer 159 may have a thickness which is sufficiently large to decrease parasitic capacitances. The thickness of the dielectric layer 159 may be a least 20 μm. In some embodiments, the dielectric layer 159 may be provided by a prefabricated board such as a circuit board or so-called pre-preg which includes partially cured B-stage epoxy resin.

In embodiments in which the lateral transistor device 140 includes three or more active areas, the gate runner 158 may extends between portions of the intermediate metallization layer 150 which are coupled to neighbouring active areas.

Figure 13:
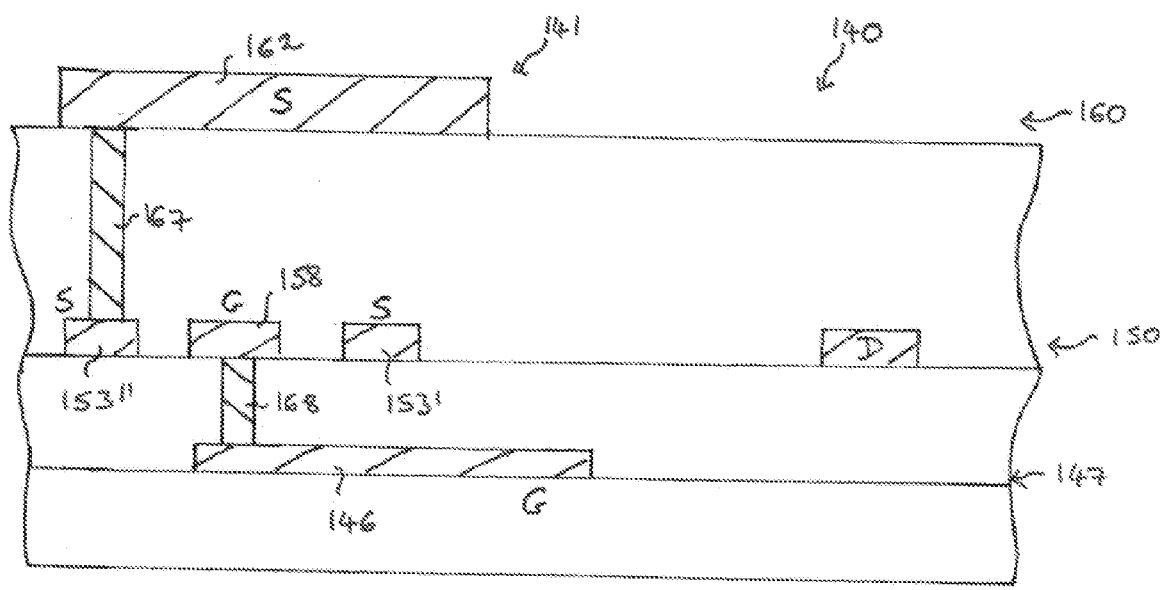
FIG. 13 illustrates a cross-sectional view along the line F-F of FIG. 10.

FIG. 13 illustrates a cross-sectional view along the line F-F of FIG. 10 through a gate strip 146 of the lower metallization structure 147.

The shape of the source bus 153' of the intermediate metallization layer 150 which is electrically coupled to the sources in two adjacent active areas may deviate from a substantially rectangular form. In the embodiment illustrated in FIG. 10, the source bus 153' has a meandering form such that wider portions of the bus are separated from one another by narrow portions. The conductive vias 167 between this source bus 153' of the intermediate metallization layer 150 and the finger 162 of the upper metallization layer may be arranged in the wider portions.

In these embodiments, the gate runner 148 is positioned between the two source buses 153', 153" and also has a meandering structure. The length of the conductive layers of the lower metallization layer 147 which are coupled to the gates may vary to compensate for the meandering structure of the gate runner 148. The finger 162 of the upper metallization layer 160 therefore is electrically coupled to both the source buses and the sources positioned in adjacent active areas.

This arrangement may be used to reduce the distance between the buses of neighbouring active areas in order to increase the packing density of active areas 142, 143 within the lateral transistor device 140.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising a lateral transistor device comprising an upper metallization layer, the upper metallization layer comprising n elongated pad regions, adjacent ones of the elongated pad regions being coupled to different current electrodes of the lateral transistor device, the n elongated pad regions bounding n-1 active regions of the lateral transistor, wherein n≥3, and wherein each of the active regions is uncovered by the upper metallization layer between the adjacent ones of the elongated pad regions.

2. The semiconductor device of claim 1, wherein the lateral transistor device comprises a LDMOS or a HEMT device.

3. The semiconductor device of claim 1, wherein the lateral transistor device comprises a Group III nitride-based lateral transistor.

4. The semiconductor device of claim 1, wherein the n elongated pad regions extend substantially parallel to one another.

5. The semiconductor device of claim 1, wherein each active area comprises a plurality of first current electrodes and a plurality of second current electrodes and a plurality of control electrodes.

6. The semiconductor device of claim 5, wherein a first one of the elongated pad regions is coupled to the first current electrodes in two adjacent active areas.

7. The semiconductor device of claim 5, wherein a second one of the elongated pad regions is coupled to the second current electrodes in two adjacent active areas.

8. The semiconductor device of claim 5, wherein the first current electrodes, the second current electrodes and the control electrodes extend substantially perpendicular to the elongated pad regions of the upper metallization layer.

9. The semiconductor device of claim 1, wherein the upper metallization layer comprises a first elongated pad region coupled to a source, a second elongated pad region coupled to a drain and a third elongated pad region coupled to the source, wherein the second elongated pad region is arranged between the first and third elongated pad regions, wherein the first elongated pad region and the second elongated pad region bound a first active region of the lateral transistor device, and wherein the second elongated pad region and the third elongated pad region bound a second active region of the lateral transistor device.

10. The semiconductor device of claim 9, wherein the first elongated pad region and the third elongated pad region of the upper metallization are electrically coupled by one or more bond wires extending between the first elongated pad region and the third elongated pad region.

11. The semiconductor device of claim 1, further comprising an intermediate metallization layer comprising three or more elongated runners, wherein adjacent ones of the elongated runners are coupled to different current electrodes of the lateral transistor, wherein each elongated runner comprises a plurality of fingers extending substantially perpendicular to the length of the runner, wherein the fingers of the adjacent elongated runners are interlocked and electrically isolated from one another.

12. The semiconductor device of 11, wherein the elongated runner of the intermediate metallization layer is arranged under an elongated pad region of the upper metallization layer.

13. The semiconductor device of claim 12, wherein the elongated runner is electrically coupled to the elongated pad region by at least one conductive via.

14. The semiconductor device of claim 11, further comprising a lower metallization layer comprising a plurality of elongated pad regions, wherein an elongated pad region is arranged under each finger of the intermediate metallization layer.

15. The semiconductor device of claim 14, wherein the elongated pad region of the lower metallization layer is electrically coupled to the finger of the intermediate metallization layer by at least one conductive via.

16. The semiconductor device of claim 14, further comprising a first dielectric layer arranged between the lower metallization and the intermediate metallization layer.

17. The semiconductor device of claim 11, further comprising a second dielectric layer arranged between the intermediate metallization layer and the upper metallization layer.

18. The semiconductor device of claim 17, wherein the upper metallization layer is spaced at a distance of at least 20 μm from intermediate metallization layer by the second dielectric layer.

19. The semiconductor device of claim 11, wherein the elongated pad regions of the lower metallization layer that are coupled to the control electrodes extend under the elongated runner of the intermediate metallization layer coupled to ground potential.

20. The semiconductor device of claim 11, wherein the elongated pad region of the upper metallization layer that is coupled to ground potential extends above the elongated runner of the intermediate metallization layer that is coupled to the control electrodes.

* * * * *